United States Patent [19]
Otto et al.

[11] Patent Number: 5,643,638
[45] Date of Patent: Jul. 1, 1997

[54] PLASMA CVD METHOD OF PRODUCING A GRADIENT LAYER

[75] Inventors: Jürgen Otto, Mannheim; Johannes Segner, Stromberg; Volker Paquet, Mainz, all of Germany

[73] Assignee: Schott Glaswerke, Mainz, Germany

[21] Appl. No.: 571,476

[22] Filed: Dec. 13, 1995

[30] Foreign Application Priority Data

Dec. 20, 1994 [DE] Germany .......................... 44 45 427.9

[51] Int. Cl.$^6$ ........................................... B05D 3/06
[52] U.S. Cl. ..................... 427/569; 427/575; 427/576; 427/578; 427/579
[58] Field of Search ..................... 427/569, 575, 427/576, 578, 579

[56] References Cited

U.S. PATENT DOCUMENTS

| | | |
|---|---|---|
| 4,830,873 | 5/1989 | Benz et al. . |
| 4,987,005 | 1/1991 | Suzuki et al. ............... 427/578 |
| 5,217,749 | 6/1993 | Denton et al. . |
| 5,295,220 | 3/1994 | Heming et al. . |
| 5,369,722 | 11/1994 | Heming et al. . |

FOREIGN PATENT DOCUMENTS

| | | |
|---|---|---|
| 0460796 | 12/1991 | European Pat. Off. . |
| 0607573 | 7/1994 | European Pat. Off. . |
| 1283136 | 11/1989 | Japan . |
| 4014440 | 1/1992 | Japan . |
| 7126419 | 5/1995 | Japan . |
| 2155496 | 9/1985 | United Kingdom . |
| 2246795 | 2/1992 | United Kingdom . |
| WO93/24243 | 12/1993 | WIPO . |

OTHER PUBLICATIONS

"Kinetics and Compositional Dependence on the Microwave Power and $SiH_4/N_2$ Flow Ratio of Silicon Nitride Deposited by Electron Cyclotron Resonance Plasmas" by Hernandez et al in J. Electrochemical Soc., 141, 1994, pp. 3234 to 3237.

"Advances in Basic and Applied Aspects of Microwave Plasma Polymerization" by M. R. Wertheimer in Thin Solid Films, 115, 1984, pp. 109 to 124.

"Thick Coatings of Doped Synthetic Silica Glass by Plasma Impulse CVD" by Kersten et al, Journal of the Ceramic Society of Japan, 99 (10), 1991, pp. 894 to 902.

*Primary Examiner*—Roy V. King
*Attorney, Agent, or Firm*—Walter Ottesen

[57] ABSTRACT

The invention relates to a plasma CVD method for producing a gradient layer wherein the layer gradient is produced in the direction of layer growth by changing at least one plasma power parameter during the coating process. According to the invention, thin gradient layers are generated with high precision by supplying the plasma power in a pulsed manner and adjusting the layer gradient by changing the plasma power parameters of pulse amplitude, pulse duration and/or pulse interval.

14 Claims, No Drawings

PLASMA CVD METHOD OF PRODUCING A GRADIENT LAYER

FIELD OF THE INVENTION

The invention relates to a plasma CVD method for producing a gradient layer wherein the layer gradient in the direction of layer growth is generated by changing at least one plasma power parameter during the coating process.

BACKGROUND OF THE INVENTION

European patent publication 0,177,517 discloses a plasma CVD process (Plasma-Chemical-Vapor-Deposition process) for applying thin transparent coatings to the surface of optical elements. This is a method for producing gradient-type scratch protective coatings especially on plastic substrates wherein the composition of the coating is so changed that the substrate side of the coating exhibits excellent adherence and the side of the substrate exposed to air exhibits high hardness. The above is achieved by continuously increasing the portion of a hardness-increasing component (preferably oxygen) to the organic coating gas (a silicon-organic compound).

The change of the layer composition comprises essentially a continuous transition from organic to inorganic in the direction of layer growth.

This method has the disadvantage that mass flows, which change as a function of time, can be adjusted to produce layers only with a process stability less than mass flows which are constant as a function of time. The layers are gradient forming in their composition. Conventionally used mass flow controllers are very sluggish with a set time of at least 0.5 seconds and therefore they are not suitable to produce layers having steep gradients (for example, 1% concentration change per nm of layer thickness) and/or very thin gradient layers (for example, an optical λ/4 layer of approximately 85 nm) wherein concentration changes must take place in the second range or lower for the usual deposition rates of 500 nm/min.

The production of such layers would be in principle possible by correspondingly reducing the deposition rate. However, this requires longer coating times and special controllers for low mass flows which are very cost intensive. Accordingly, this procedure is very disadvantageous economically. In principle, it would be possible, for example, to correspondingly thin the coating gas to obtain reduced coating rates. However, this can result in unwanted effects on other layer characteristics such as the refractive index. In this connection, reference can be made to the article of Hernandez et al entitled "Kinetics and Compositional Dependence on the Microwave Power and $SiH_4/N_2$ Flow Ratio of Silicon Nitride Deposited by Electron Cyclotron Resonance Plasmas" published in the J. Electrochem. Soc., Volume 141, No. 11, November 1994, pages 3234 to 3237.

An article by Wertheimer et al entitled "Advances in Basic and Applied Aspects of Microwave Plasma Polymerization" published in Thin Solid Films, Volume 115 (1984), pages 109 to 124, discloses that, in plasma polymerization of HMDSO (hexamethyldisiloxane), the following occurs with increasing power and/or substrate temperature: the structure of the deposited layer changes, the content as to organic constituents significantly decreases, the etch rate of the layer increases and the refractive index increases with increasing substrate temperature.

The above effect is utilized in the method disclosed in U.S. Pat. No. 5,217,749 for producing a refractive-index gradient layer. In this method, layers are polymerized with a PCVD method from the monomer vapor of an organic compound. A refractive index gradient in the direction of layer growth is generated only by continuously changing the process power level during the coating process.

In this method, several mechanisms however operate so that a targeted change of the layer composition becomes problematical.

On the one hand, the production of the layers takes place from coating gases wherein fresh gas and residual gas from the previous reaction are mixed with each other in an undefined manner. The composition of the layer produced and the layer characteristics dependent thereon can change in an undefined manner because of this situation when any one of the coating parameters is changed. On the other hand, when increasing the power level, the substrate temperature increases whereby the unwanted change of the parameter, substrate temperature, is produced by the wanted change of the parameter, power. Furthermore, a reduction in species capable of reaction takes place in the direction of the flow of the supplied fresh gas over the substrate so that the layer characteristics are different in this direction. The second mechanism furthermore causes the situation that heat-sensitive substrates cannot be coated.

Furthermore, it is disadvantageous that the coating rate of approximately 4 nm/min is very low and can be increased apparently only at the cost of lateral uniformity for the given pressure of 60 mTorr and the RF-power by increasing the mass flow of the coating gas.

SUMMARY OF THE INVENTION

It is an object of the invention to provide a method with which layer gradients can be adjusted with high precision even for very thin layers. Furthermore, it is an object of the invention to provide such a method which is economical and which can be carried out quickly.

This object is achieved with the method of the invention in that the plasma power is applied in a pulsed manner (Plasma Pulse CVD method) and the layer gradient is adjusted in the direction of layer growth by changing the plasma power parameters of: pulse amplitude, pulse width and/or pulse interval during the coating process.

Plasma pulse CVD methods are known and are described, for example, in the article of Kersten et al entitled "Thick Coatings of Doped Synthetic Silica Glass by Plasma Impulse CVD" published in the journal of the Ceramic Society of Japan 99 (10), pages 894 to 902 (1991). In these methods, the electromagnetic radiation which excites the plasma is supplied in a pulsed manner for continuous flow of the coating gases. With each pulse, a thin layer (typically approximately 1 nm) is deposited on the substrate. Even substrates which are not stable to temperature can be deposited during a pulse of high power because a pulse interval follows each power pulse. In this way, especially high coating rates are possible without significant temperature loading of the substrate.

It has been surprisingly shown that by applying such a plasma pulse CVD method, a change of the power, which is supplied for generating and maintaining the plasma, is not decisive for producing a gradient layer. This is in contrast to the state of the art for continuous methods. Instead, the amplitude and duration of the power pulse as well as the duration of the pulse interval are decisive for the production of a gradient layer. The supplied mean power for a plasma pulse method is computed as follows:

$$= \frac{\text{Pulse Amplitude} \times \text{Pulse Width}}{\text{Pulse Interval} + \text{Pulse Width}}$$

This mean power is in the method of the invention in the same order of magnitude as the power set in the conventional continuous method. The power can even be less. This is especially of significance in the coating of heat-sensitive plastics or when via the substrate temperature layer characteristics such as hardness or hydrophily are to be affected. The mean power can be adjusted in a simple manner for a plasma pulse CVD method via the length of the pulse interval and/or pulse width and/or the magnitude of the pulse amplitude.

The pulse amplitude is a measure of power in a plasma pulse CVD method. This measure of power corresponds to the pulse power, that is, the product of the generator voltage and the generator current during the duration of a pulse. The portion of the power which is actually coupled into the plasma is dependent upon a series of parameters such as the dimensioning of the component emitting the pulse and the reactor.

The following are dependent upon pulse amplitude:

(a) starting at a threshold value which is characteristic for each gas, different excitations and reactions are generated in the plasma; and, (b) different thicknesses of the plasma zone are adjusted.

By using the plasma pulse CVD method according to the invention, elementary layers (single layers) of different composition can be deposited. The elementary layers are deposited in a targeted manner pulse for pulse by appropriate selection of the pulse amplitude. With respect to the plasma pulse CVD method, a suitable selection of the pulse interval assures that the gas composition is always the same for each pulse, for example, by a clean separation of the exhaust gas from the fresh gas. The above is not possible with the conventional plasma CVD methods.

During the duration of a pulse, the following actions take place sequentially in dependence upon the pulse width: reaction, deposition and after-treatment.

The after-treatment can cause warming of the substrate, plasma etching, separation of layer components, hardening of the layer, oxidation of the layer surface and implantation or addition of gases of the plasma in the layer.

It can be assumed that the change of pulse duration during the coating process acts especially in the after-treatment and therefore effects the different layer characteristics in the elementary layers by a more or less intensive after-treatment.

The pulse interval determines, on the one hand, the temperature course of the substrate during coating and, on the other hand, the portion of the exhaust gas molecules from the previous plasma pulse in the actual coating gas when the pulse interval is deliberately made shorter than required for a clean separation of fresh gas and exhaust gas. The influence on the layer composition or layer characteristics for pulse intervals is configured somewhat weaker than for pulse amplitude and pulse duration.

What is also important here is that the pulse duration in comparison to the flow speed of the gas is so selected that the gas can be considered to be at rest during the pulse.

The following preferred ranges for the power parameters have been experimentally determined as follows:

pulse duration 0.01 to 10 msec
pulse interval 1 to 1,000 msec
pulse amplitude 10 to 100,000 W.

The ignition field intensity is different depending upon the layer-forming substances so that the minimum pulse amplitude is specific to the gas.

With the aid of the method of the invention, layers having a composition gradient and/or structure gradient can be produced. Via these gradients, specific physical and/or chemical characteristics can be varied in a targeted manner. These physical and/or chemical characteristics include, for example: refractive index, hardness, internal stress, hydrophily or general wetting ability, module of elasticity and the like. Gradient layers having constant composition but changeable physical/chemical characteristics can be produced. An example of this is the production of a $TiO_2$ layer from $TiCl_4+O_2$. For the production of a $TiO_2$ layer having characteristics which come close to solid material, a specific pulse amplitude and pulse duration are necessary. By shortening the pulse duration, the $TiO_2$ layer becomes increasingly porous in the direction of growth and the refractive index (and hardness) is lower even though the layer composition is constant over the layer thickness.

It was especially found that, by increasing pulse width and/or pulse amplitude, the organic content (that is, the content as to hydrocarbons) of a layer can be reduced for a layer produced from a metal-organic, and especially a silicon-organic layer-forming substance.

In the invention, a coating gas is used which contains a metal-organic layer-forming substance (especially a Si-organic layer-forming substance) and, if required, oxygen or nitrogen or a gas which releases oxygen or nitrogen in a plasma. With this coating gas, the invention permits, without a change in the composition of the gas, to vary the organic content of the layer produced and permits to vary the characteristics (which are dependent upon said organic content), both only by selecting the characteristics of the pulse (duration, amplitude) or by selecting the duration of the pulse interval.

From a reaction mixture comprising HMDSO+15% $O_2$, a virtually inorganic layer is deposited, for example, for a large pulse duration ($\geq 1$ ms) and a virtually organic layer for a small pulse duration ($\leq 0.1$ ms).

The method of the invention is therefore especially suited for producing scratch protective coatings on plastic substrates (for example, for optical applications such as spectacle lenses). Such scratch protective coatings exhibit a high content of organic material on the substrate side while, in the direction of layer growth, a transition (organic→inorganic) is provided. Such scratch protective coatings, for example, for spectacle lenses, are described, inter alia, in European patent publication 0,177,517.

Si-organic compounds such as hexamethylsiloxane (HMDSO), hexamethylsilazane (HMDS), tetraethoxysilane (TEOS), tetramethoxysilane, tetramethylsilane are especially suitable for producing scratch protective coatings on spectacle lenses with the aid of the method of the invention. This is because the hard side of the coating can be made to be similar to quartz. In the case where the layer-forming substance does not contain an adequate number of oxygen atoms, then oxygen can be added into the coating gas.

The addition of oxygen, nitrogen or a gas which releases oxygen or nitrogen in a plasma serves generally to provide an oxygen compound or a nitrogen compound via a reaction treatment step or to increase the number of the oxygen atoms or nitrogen atoms in a layer. In the same manner, nitrogen or ammonia must be added into the coating gas if the hardness increase takes place via Si-nitride formation or Si-oxynitride formation. Organic Ti compounds and Al compounds and other metal organic compounds can be introduced to produce gradient layers in a corresponding manner.

The method of the invention is also especially suitable for producing primer coatings (a coating applied to a substrate to improve adhesion).

Primer coatings are auxiliary coatings which are needed when the function layers do not enter into a tight bond with the substrates and separate under load. This happens often when substrate and function layer are of different types, for example, for the combination of organic/inorganic or metallic/oxidic.

In such cases, a bond between substrate and function layer is achieved via a primer coating which, typically, is related to the function layer as well as to the substrate. With respect to the first example given above, the primer coating is made of an inorganic material having an organic content.

A better solution comprises configuring the primer coating as a gradient layer. This gradient layer is, for example, completely organic on the substrate side or is organic to a large amount and the composition of the layer changes continuously so that it is completely or to a large extent inorganic on the function layer side. This solution is better for the reason that the boundary surfaces of the primer coating to the substrate and function layer can be made practically of the same type.

The method of the invention is likewise applicable to organic layer-forming substances (such as ethylene) without metal components. In this case, an increase in the pulse duration and/or pulse amplitude effects a more intense crosslinking and/or a reduction of the hydrogen content. A reduction of the hydrogen content means a greater hardness and higher refractive index.

In a coating experiment, a substantially transparent soft polymer layer was generated from methane, for example, at a small pulse amplitude of 400 W with the polymer layer having an index of refraction of 1.47. At a pulse amplitude of 1,100 W, a brown harder layer having a refractive index of 1.58 was obtained. The remaining coating parameters were:

| | |
|---|---|
| mass flow $CH_4$ | 25 sccm |
| pulse interval | 40 ms |
| pulse duration | 1 ms |
| excitation frequency | 2.45 GHz |
| substrate temperature | 50° C. |

(microwave plasma pulse CVD method).

Layer compositions or layer structures of the method of the invention are adjusted virtually without delay and by switching electric fields and not via comparatively slow changes in concentration of the coating gas (effected by mass flow changes). For this reason, the adjustments can be performed with great speed. In addition, it is also possible to obtain an additional effect by an additional change of the coating gas composition. Electronically, it is not difficult to change the pulse form from one pulse to the next. On the other hand, in a typical microwave plasma pulse CVD method with, for example, HMDSO as layer-forming substance, layers of 0.1 to 1.0 nm thickness can be deposited which, for a pulse interval of for example 20 ms, results in a coating rate of up to 3,000 nm/min so that, for high coating rates, thin (for example, optical $\lambda/4$ layers) as well as thick layers containing hydrocarbons in gradient form can be produced with very high precision in the direction of layer growth (monolayer region).

The plasma pulse CVD method can be carried out with alternating current voltage pulses having a frequency between approximately 50 kHz and 300 GHz. Microwave frequencies are especially suitable because of the high coating rate and the possibility to work in a comparatively wide pressure range (0.001 to approximately 10 mbar). With respect to microwave frequencies, the frequency of 2.45 GHz is preferred because the corresponding microwave components are easily obtained and are cost effective. The pulse method further affords the advantage that it is possible to form the pulse itself and thereby further influence the characteristics of the thin layer in the direction of growth of the layer which is deposited via a single plasma pulse. Especially pulse widths between 0.1 and 2 ms and pulse intervals between 5 and 500 ms have been shown to be suitable for producing the layer types in accordance with the invention at a pressure of 0.1 to 2 mbar and an excitation frequency of 2.45 GHz. When the reaction times in the plasma are very small, pulse widths of 0.01 ms are purposeful; the application of such short pulses is however often limited by limitations of the apparatus (pulse rise time). The recommended range for pulse amplitude cannot be given in numbers. The minimum value is the value at which the particular coating gas and the remaining process parameters can ignite the discharge. The maximum value is given by the power capacity of the pulse generator used.

For producing a gradient layer, one would, as a rule, proceed such that, in an initial experimental sequence, the dependence of the layer characteristics or layer compositions from pulse duration, pulse amplitude and pulse interval is determined. For producing the actual gradient layer, these parameters are so controlled that the desired gradient occurs in the direction of growth of the layer. The precision with which the gradient is determined initially is governed by the requirements imposed on the layer. According to the method of the invention, it is possible without difficulty to change the composition of the layer on the substrate in the direction of layer growth from one layer to the next.

The invention will now be described in greater detail with respect to specific examples.

As the example which follows will show, the coating gas can contain several layer-forming substances, such as five. The portions of the layer-forming substances in the deposited layer are changed if the pulse parameters are suitably changed during the coating process. By changing the pulse duration so that it increases, first the layer-forming substances with the shortest reaction time become manifest in the layer.

EXAMPLE 1

Forming a layer of $TiO_aC_bH_cSi_d$ by varying pulse width.

| Gas mixture of $TiCl_4$ + HMDSO + $O_2$: | |
|---|---|
| mass flow $TiCl_4$ | 5 sccm |
| mass flow HMDSO | 20 sccm |
| mass flow $O_2$ | 75 sccm |
| pulse interval | 50 ms |
| frequency | 2.45 GHz |
| substrate temperature | 60° C. |
| pressure | 0.5 mbar. |

For a short pulse duration (approximately 0.3 ms), the layer comprises $TiO_aC_bH_cSi_d$ and at larger pulse durations (approximately 1.1 ms), the layer comprises $TiO_eC_fH_gSi_h$ wherein a>e, b>f, c>g, d>h.

EXAMPLE 2

Production of a $SiO_2$ layer by varying the pulse duration. The $SiO_2$ layer forms a gradient with respect to inner stress, hardness and hydrophily.

A substrate plate of glass was coated for 5 minutes utilizing a microwave plasma pulse CVD method. A coating gas of oxygen and hexamethyldisiloxane (HMDSO) was used.

| | |
|---|---|
| $O_2$ mass flow | 100 sccm |
| HMDSO mass flow | 12.5 sccm |
| pulse interval | 90 ms |
| pulse duration | 0.5 to 1.5 ms increasing linearly with time |
| pulse amplitude | 45% of the maximum value of a 6 KW magnetron |
| process pressure | 0.6 mbar |
| substrate temperature | 70° C. and 140° C. |
| coating duration | 5 min |
| layer thickness | 2,100 and 1,800 nm (for 70° C. and 140° C.). |

Result:

| | Pulse Duration Ms | Internal Stress MPa | Hydrophily *) | Hardness **) |
|---|---|---|---|---|
| 70° C. | | | | |
| Start | 0.5 | 22.5 | 9.6 | 5 |
| End of the Coating Process | 1.5 | 1.0 | 17.3 | 3 |
| 140° C. | | | | |
| Start | 0.5 | −3.5 | 10.3 | 4 |
| End of the Coating Process | 1.5 | −29.1 | 10.0 | 2 |

*)Measurement number for hydrophily is the wetting surface of a water drop on the deposited layer (in $mm^2$)
**)measured in accordance with German Industrial Standard (DIN) 58 196 T4

In these examples, the temperature was maintained precisely within ±10° in each instance; whereas, in accordance with the state of the art, temperature changes of >100° are required in order to obtain significant composition changes or characteristic changes.

EXAMPLE 3

Producing a layer having a hardness gradient by varying the pulse power and pulse interval.

A substrate plate of CR39 was coated for 5 minutes in a microwave plasma pulse CVD method with a coating gas mixture of 80 sccm oxygen and 12 sccm HMDSO.

| | |
|---|---|
| $O_2$ mass flow | 80 sccm |
| HMDSO mass flow | 12 sccm |
| pulse amplitude | 20% to 50% of the maximum value of a 6 KW magnetron which increases linearly as a function of time |
| pulse interval | 20 ms to 75 ms increasing linearly as a function of time |
| pulse duration | 1 ms |
| process pressure | 0.5 mbar |
| substrate temperature | 40° C. |
| Result: | Hardness *) |
| Layer start | 5 |
| Layer end | 2–3 |

*)measured pursuant to German Industrial Standard 58 196 T4

EXAMPLE 4

Producing a primer layer for an optical sensor.

A substrate plate made of polycarbonate was coated with a 200 nm thick wave-conducting $TiO_2$ layer pursuant to the plasma pulse CVD method in accordance with U.S. Pat. No. 5,369,722 incorporated herein by reference. For further processing to an optical sensor, the coated substrate must be treated with alkaline and acidic solutions. To increase layer adherence, an intermediate layer configured as a primer layer was placed between substrate and the wave-conducting layer. The production parameters of the primer coating were:

| | |
|---|---|
| Total mass flow: $O_2$ + HMDSO: | 100 sccm |
| HMDSO portion | 40 sccm |
| Pulse amplitude | 40% of the maximum value of a 6 kW magnetron |
| Pulse interval | 30 ms |
| Pulse duration | increasing linearly as a function of time from 0.3 to 0.7 msec |
| Coating duration | 4 sec |
| Layer thickness | 50 nm |
| Process pressure | 0.5 mbar |
| Substrate temperature | 70° C. |

Test results:

After a storage time of 24 hours in an acidic solution and 24 hours in an alkaline solution, the coating was subjected to and passed a tape test and therefore was suitable for the purpose intended for. The tape test consists of placing TESAFILM tape on the coating and then removing the tape.

A primer layer produced at a constant pulse duration of 0.3 ms with otherwise constant coating parameters as above is, in contrast, cloudy and destroys the waveguide. A primer layer produced at a constant pulse duration of 0.7 ms with otherwise like coating parameters leads, in contrast, to a poor adherence of the coating.

It is understood that the foregoing description is that of the preferred embodiments of the invention and that various changes and modifications may be made thereto without departing from the spirit and scope of the invention as defined in the appended claims.

What is claimed is:

1. A plasma CVD method for producing a layer wherein a layer composition or structure gradient is generated in the direction of layer growth by changing at least one of plasma power parameters during the coating process, the method comprising the steps of:

supplying a plasma power as a power pulse train in a plasma pulse CVD method wherein the pulse train has the parameters of pulse amplitude, pulse width and pulse interval; and, generating said layer gradient of said layer by changing at least one of said pulse amplitude, pulse width and pulse interval.

2. The plasma CVD method of claim 1, wherein said layer gradient is in the layer composition.

3. The plasma CVD method of claim 2, wherein said gradient in said layer is defined by a transition from organic to inorganic.

4. The plasma CVD method of claim 1, wherein said gradient is a gradient in the structure of said layer.

5. The plasma CVD method of claim 1, wherein said layer gradient is varied so as to provide a gradient of at least one of the following characteristics: hardness, wattability, refractive index, absorption, porosity, crystal structure, module of elasticity and electrical conductivity.

6. The plasma CVD method of claim 1, comprising the further steps of:

using a coating gas having layer-forming substances; and, changing said plasma parameters during the coating process to vary the portions of said layer-forming substances relative to each other in the deposited layer.

7. The plasma CVD method of claim 1, comprising the further step of depositing a coating from a coating gas which contains at least one metal-organic layer-forming substance to produce a scratch-protective layer for plastic spectacle lenses.

8. The plasma CVD method of claim 7, wherein said metal-organic layer forming substance is hexamethylsiloxane (HMDSO).

9. The plasma CVD method of claim 8, comprising the further step of adding to said coating gas oxygen, nitrogen and/or a gas which releases oxygen and/or nitrogen in the plasma.

10. The plasma CVD method of claim 9, the method comprising the further step of exciting said plasma by means of microwave radiation.

11. The plasma CVD method of claim 10, wherein the excitation frequency of said microwave radiation is 2.45 GHz.

12. The plasma CVD method of claim 7, wherein said gradient of said layer is generated by changing the pulse width during the coating process.

13. The plasma CVD method of claim 12, wherein said pulse width is varied between 0.1 and 0.2 msec.

14. The plasma CVD method of claim 7, wherein the composition of said coating gas is changed during the coating process.

* * * * *

UNITED STATES PATENT AND TRADEMARK OFFICE
CERTIFICATE OF CORRECTION

PATENT NO. : 5,643,638
DATED : July 1, 1997
INVENTOR(S) : Juergen Otto, Johannes Segner and Volker Paquet It is certified that error appears in the above-indentified patent and that said Letters Patent is hereby corrected as shown below:

```
     In column 9, line 1: please delete "wattability" and
substitute  -- wettability -- therefor.
```

Signed and Sealed this

Ninth Day of September, 1997

Attest:

BRUCE LEHMAN

Attesting Officer

Commissioner of Patents and Trademarks